(12) United States Patent
Lee et al.

(10) Patent No.: US 10,881,000 B1
(45) Date of Patent: Dec. 29, 2020

(54) PRINTED CIRCUIT BOARD

(71) Applicant: SAMSUNG ELECTRO-MECHANICS CO., LTD., Suwon-si (KR)

(72) Inventors: Yang Je Lee, Suwon-si (KR); Hyun Kyung Park, Suwon-si (KR); Jung Hoon Jang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/801,925

(22) Filed: Feb. 26, 2020

(30) Foreign Application Priority Data

Dec. 16, 2019 (KR) ........................ 10-2019-0167956

(51) Int. Cl.
*H05K 1/11* (2006.01)
*H05K 1/02* (2006.01)

(52) U.S. Cl.
CPC .......... *H05K 1/115* (2013.01); *H05K 1/0277* (2013.01); *H05K 1/0281* (2013.01); *H05K 2201/09018* (2013.01)

(58) Field of Classification Search
CPC ........ H05K 1/08; H05K 1/028; H05K 1/0281; H05K 1/118; H05K 3/4691
See application file for complete search history.

(56) References Cited

U.S. PATENT DOCUMENTS

| 2010/0059262 | A1* | 3/2010 | Weidinger | ........... H05K 3/4691 |
| | | | | 174/258 |
| 2014/0268594 | A1* | 9/2014 | Wang | ..................... H05K 1/189 |
| | | | | 361/749 |
| 2019/0090362 | A1* | 3/2019 | Yosui | ....................... H05K 1/18 |

FOREIGN PATENT DOCUMENTS

| KR | 10-1131289 | B1 | 3/2012 |
| KR | 10-2018-0005300 | A | 1/2018 |

* cited by examiner

*Primary Examiner* — Jeremy C Norris
(74) *Attorney, Agent, or Firm* — Morgan, Lewis & Bockius LLP

(57) ABSTRACT

A printed circuit board includes a core layer having a first surface and a second surface opposing the first surface; a first built-up structure disposed on the first surface of the core layer; a second built-up structure disposed on the second surface of the core layer; and a first penetration portion penetrating the first built-up structure and the core layer and penetrating a portion of the second built-up structure. The first penetration portion has a step portion on at least a portion of a wall of the first penetration portion in the region of the first penetration portion penetrating the second built-up structure, and a region including the first penetration portion on a plane is configured as a flexible region.

20 Claims, 7 Drawing Sheets

PRINTED CIRCUIT BOARD

CROSS-REFERENCE TO RELATED APPLICATION(S)

This application claims benefit of priority to Korean Patent Application No. 10-2019-0167956 filed on Dec. 16, 2019 in the Korean Intellectual Property Office, the disclosure of which is incorporated herein by reference in its entirety.

TECHNICAL FIELD

The present disclosure relates to a printed circuit board, and more particularly, a printed circuit board having a flexible region.

BACKGROUND

With the expansion of the market for fifth generation (5G) communications services for the transmission of large volume data at ultra-high speed, demand for a low-loss and rigid-flexible printed circuit board has increased. A rigid-flexible printed circuit board may be provided by securing a flexible region by forming a penetration portion in a multi-layer substrate including a fine circuit.

SUMMARY

An aspect of the present disclosure is to provide a printed circuit board having a penetration portion configured as a flexible region.

Another aspect of the present disclosure is to provide a printed circuit board in which a polymer layer, rather than a metal layer such as copper, is used as a stopper layer to form a penetration portion.

According to an aspect of the present disclosure, a printed circuit board includes a core layer having a first surface and a second surface opposing the first surface; a first built-up structure disposed on the first surface of the core layer and including a plurality of first insulating layers and a plurality of first wiring layers; a second built-up structure disposed on the second surface of the core layer and including a plurality of second insulating layers and a plurality of second wiring layers; and a first penetration portion penetrating the first built-up structure and the core layer and penetrating a portion of the second built-up structure. The first penetration portion has a step portion on at least a portion of a wall of the first penetration portion in the region of the first penetration portion penetrating the second built-up structure, and a region including the first penetration portion on a plane is configured as a flexible region.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
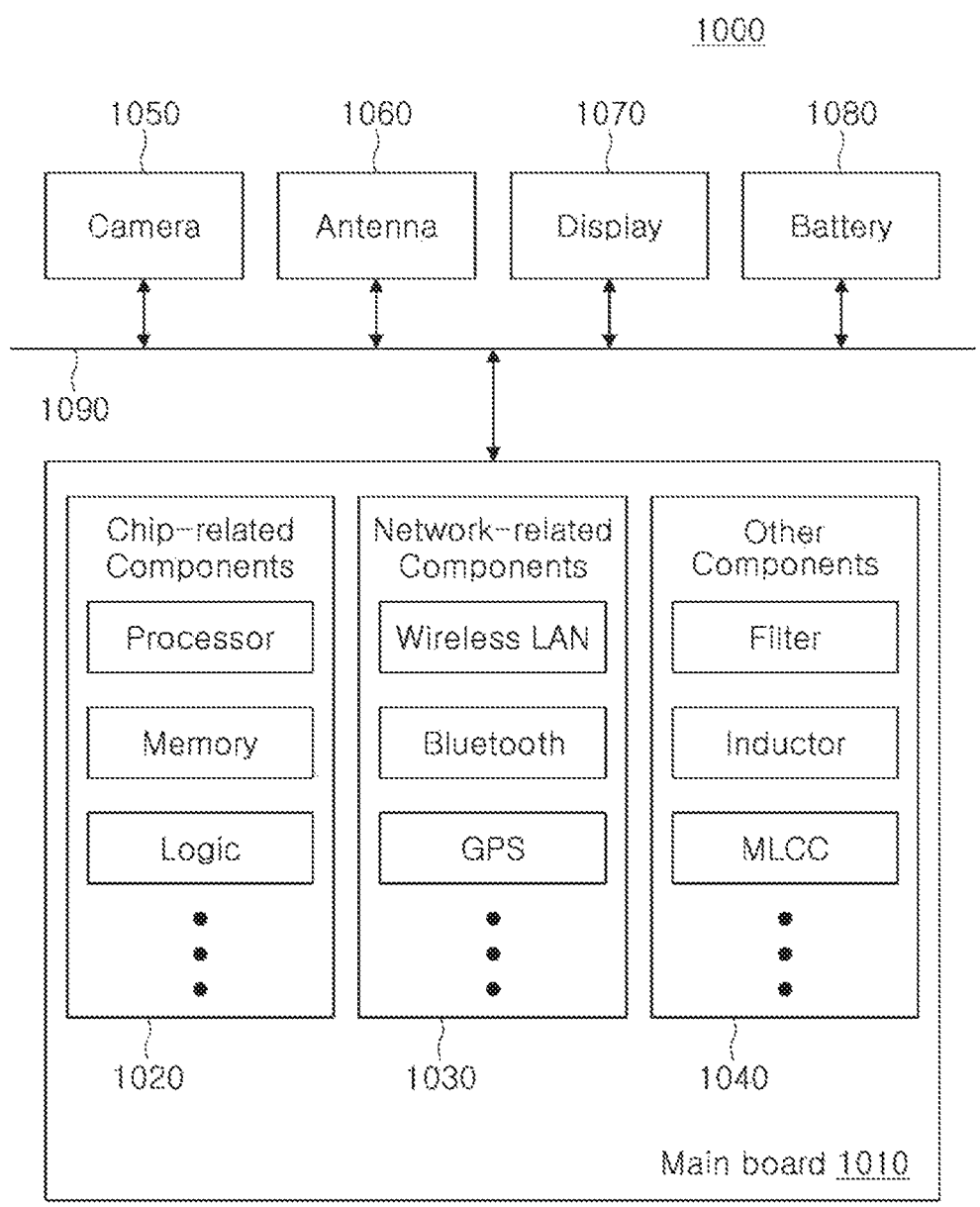
FIG. 1 is a block diagram illustrating an electronic device system according to an example embodiment of the present disclosure.

Hereinafter, example embodiments of the present disclosure will be described with reference to the accompanying drawings. In the drawings, shapes, sizes, and the like, of elements may be exaggerated or briefly illustrated for clarity of description.

Electronic Device

FIG. 1 is a block diagram illustrating an electronic device system according to an example embodiment.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other. The chip related components 1020 may be configured as a package-type chip component including the above-described chips or electronic components.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
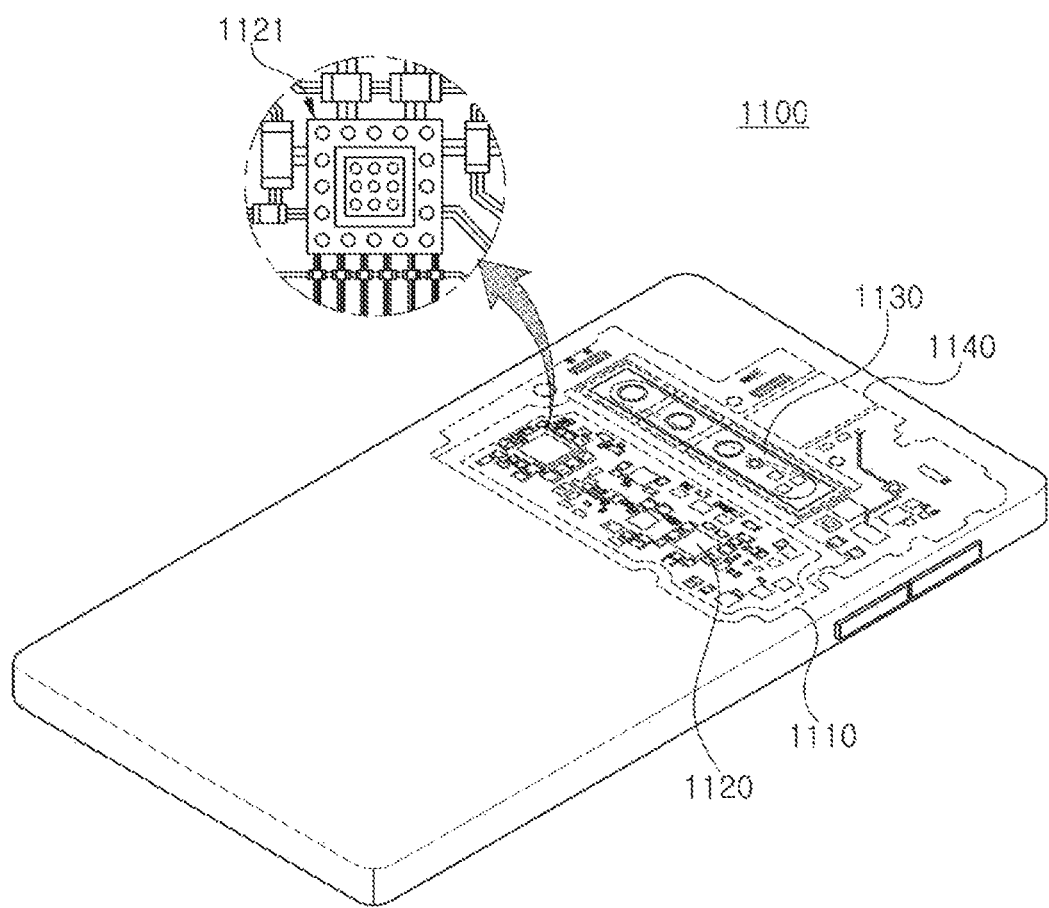
FIG. 2 is a perspective diagram illustrating an electronic device according to an example embodiment of the present disclosure.

FIG. 2 is a perspective diagram illustrating an electronic device according to an example embodiment.

Referring to FIG. 2, the electronic device may be implemented by a smartphone 1100, for example. A mainboard 1110 may be accommodated in the smartphone 1100, and various electronic components 1120 may be physically and/or electrically connected to the mainboard 1110. In addition, other components that may or may not be physically and/or electrically connected to the mainboard 1110, such as a camera module 1130 and/or a speaker 1140, may be accommodated in the smartphone 1100. Some of the electronic components 1120 may be configured as the chip related components, for example, an antenna module 1121, but are not limited thereto. In the antenna module 1121, the electronic component may be surface-mounted on the printed circuit board, but an example embodiment thereof is not limited thereto. The electronic device is not necessarily limited to the smartphone 1100, but may be implemented by other types of electronic devices as described above.

Printed Circuit Board

Figure 3:
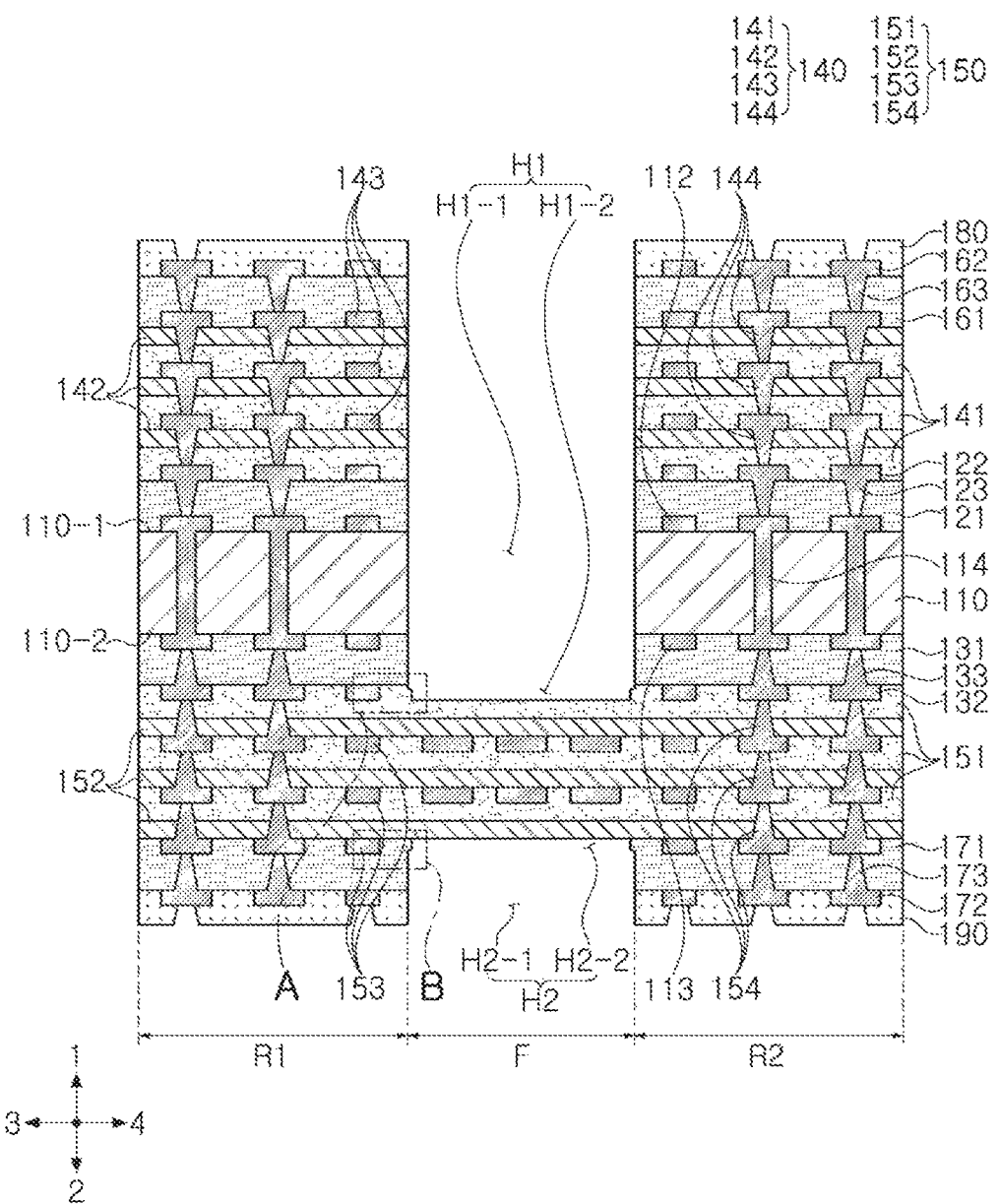
FIG. 3 is a cross-sectional diagram illustrating a printed circuit board according to an example embodiment of the present disclosure.

FIG. 3 is a cross-sectional diagram illustrating a printed circuit board according to an example embodiment.

Referring to the diagram, the printed circuit board in the example embodiment may include a first wiring layer 112 disposed on a first surface 110-1 of a core layer 110, a second wiring layer 113 disposed on a second surface 110-2 opposing the first surface 110-1, and a though-via 114 penetrating the core layer 110 and connecting the first wiring layer 112 to the second wiring layer 113.

The printed circuit board in the example embodiment may further include a first resin layer 121 disposed on the first surface 110-1 of the core layer 110 and covering the first wiring layer 112, a third wiring layer 122 disposed on the first resin layer 121, a first via 123 penetrating the first resin layer 121 and connecting the first wiring layer 112 to the third wiring layer 122, a second resin layer 131 disposed on the second surface 110-2 of the of the core layer 110 and covering the second wiring layer 113, a fourth wiring layer 132 disposed on the second resin layer 131, and a second via 133 penetrating the second resin layer 131 and connecting the second wiring layer 113 to the fourth wiring layer 132.

The number of each of the first resin layer 121 and/or the second resin layer 131 may be greater or less than the examples illustrated in the diagram. For example, a first built-up structure 140 and a second built-up structure 150 may be disposed on both surfaces of the core layer 110, the first surface 110-1 and the second surface 110-2 of the core layer 110, respectively, without the first resin layer 121 and the second resin layer 131. As another example, a single first resin layer 121 may be provided, and two second resin layers 131 may be provided. Depending on the number of the first resin layer 121 and/or the second resin layer 131, the number of each of the third wiring layer 122, the fourth wiring layer 132, the first via 123 and/or the second via 133 may be higher or lower than the examples illustrated in the diagrams.

The printed circuit board in the example embodiment may further include the first built-up structure 140 disposed on the first resin layer 121 and the second built-up structure 150 disposed on the second resin layer 131. The configurations of the first built-up structure 140 and the second built-up structure 150 will be described in greater detail later.

The printed circuit board in the example embodiment may further include a third resin layer 161 disposed on the first built-up structure 140, a fifth wiring layer 162 disposed on the third resin layer 161, a third via 163 penetrating the third resin layer 161 and connecting the fifth wiring layer 162 to a wiring layer 143 included in the first built-up structure 140, a fourth resin layer 171 disposed on the second built-up structure 150, a sixth wiring layer 172 disposed on the fourth resin layer 171, and a fourth via 173 penetrating the fourth resin layer 171 and connecting the sixth wiring layer 172 to a wiring layer 153 included in the second built-up structure 150.

The number of each of the third resin layer 161 and the fourth resin layer 171 may be greater or less than the example illustrated in the diagram. For example, a first passivation layer and a second passivation layer 190 may be disposed on both surfaces of each of the first built-up structure 140 and the second built-up structure 150, respectively, without the third resin layer 161 and the fourth resin layer 171. As another example, a single third resin layer 161 may be provided, and two fourth resin layers 171 may be provided. Depending on the number of each of the third resin layer 161 and/or the fourth resin layer 171, the number of each of the fifth wiring layer 162, the sixth wiring layer 172, the third via 163, and/or the fourth via 173 may also be greater or less than the example illustrated in the diagram.

The printed circuit board in the example embodiment may further include the first passivation layer 180 disposed on the third resin layer 161 and having an opening (no reference numeral) for exposing at least a portion of the fifth wiring layer 162. Also, the printed circuit board in the example embodiment may further include the second passivation layer 190 disposed on the fourth resin layer 171 and having an opening (no reference numeral) for exposing at least a portion of the sixth wiring layer 172.

The printed circuit board in the example embodiment may have a first penetration portion H1 and a second penetration portion H2.

The first penetration portion H1 may penetrate a portion of the printed circuit board in the example embodiment in a second direction 2. For example, as illustrated in the diagram, the first penetration portion H1 may penetrate the first passivation layer 180, the third resin layer 161, the first built-up structure 140, the first resin layer 121, the core layer 110, and the second resin layer 131 in order and may further penetrate a portion of a second insulating layer 151 of the second built-up structure 150. The second insulating layer 151 of the second built-up structure 150 penetrated by the first penetration portion H1 may be configured as an uppermost second insulating layer 151 of a plurality of second insulating layers 151. When the printed circuit board in the example embodiment does not include the first to fourth resin layers 121, 131, 161, and 171 and/or the first and second passivation layers 180 and 190, the first penetration portion H1 may not penetrate the elements which are not included in the printed circuit board in the example embodiment.

The first penetration portion H1 and the second penetration portion H2 may have different depths. For example, a depth of the first penetration portion H1 may be greater than a depth of the second penetration portion H2. A depth may refer to a length measured in a first direction 1 or a second direction 2.

The first penetration portion H1 may include a 1-1 penetration portion H1-1 and a 1-2 penetration portion H1-2. Referring to the diagram, the 1-1 penetration portion H1-1 may penetrate the first passivation layer 180, the third resin layer 161, the first built-up structure 140, the first resin layer 121, the core layer 110, and the second resin layer 131 in order and may further penetrate a portion of the second insulating layer 151 of the second built-up structure 150. The 1-2 penetration portion H1-2 may extend from the 1-1 penetration portion H1-1 and may further penetrate another portion of the second insulating layer 151 of the second built-up structure 150. Accordingly, a boundary between the 1-1 penetration portion H1-1 and the 1-2 penetration portion H1-2 may be disposed on a level between an upper surface and a lower surface of the second insulating layer 151 of the second built-up structure 150. For example, the boundary between the 1-1 penetration portion H1-1 and the 1-2 penetration portion H1-2 may be disposed on a level between an upper surface and a lower surface of an uppermost second insulating layer 151 of the plurality of second insulating layers 151 of the second built-up structure 150. Accordingly, the first penetration portion H1 may have a step portion on at least a portion of a wall of the first penetration portion H1 in a region of the first penetration portion H1 penetrating the second built-up structure 150.

The second penetration portion H2 may penetrate a portion of the printed circuit board of the example embodiment in the first direction 1. For example, the second penetration portion H2 may penetrate the second passivation layer 190 and may further penetrate the fourth resin layer 171.

The second penetration portion H2 may include a 2-1 penetration portion H2-1 and a 2-2 penetration portion H2-2. Referring to the diagram, the 2-1 penetration portion H2-1 may penetrate the second passivation layer 190 and may further penetrate a portion of the fourth resin layer 171. The 2-2 penetration portion H2-2 may extend from the 2-1 penetration portion H2-1 and may further penetrate another portion of the fourth resin layer 171.

Differently from the first penetration portion H1 penetrating a portion of a bonding layer 151, the second penetration portion H2 may penetrate all the way through the fourth resin layer 171. The above-described difference may result from different positions of polymer layers used for forming the penetration portions in the printed circuit board having a two-sided built-up structure.

In the printed circuit board in the example embodiment, a region in which the first penetration portion H1 and the second penetration portion H2 are formed may be configured as a flexible region F, and the other regions in which the first penetration portion H1 and the second penetration portion H2 are not formed may be configured as rigid regions R1 and R2.

Accordingly, in the printed circuit board in the example embodiment, the region in which the first penetration portion H1 and the second penetration portion H2 are disposed is configured as the flexible region F. The flexible region F may refer to a region which may have a level of bendability higher than that of the rigid regions R1 and R2. To provide the flexible region F, the first penetration portion H1 and the second penetration portion H2 may be configured to be blocked by two opposing side portions of four side portions by the rigid regions R1 and R2, and the other two side portions disposed therebetween may be configured to be open. Accordingly, the core layer 110, the first to fourth resin layers 121, 131, 161, and 171, and the first and second passivation layers 180 and 190, included in the rigid regions R1 and R2, may not be disposed in the flexible region F. The first built-up structure 140 may not also be disposed in the flexible region F. The rigid regions R1 and R2 may be spaced apart from each other by the flexible region F.

The core layer 110 may have an elastic modulus higher than that of each of the first insulating layer 141 and a first film layer 142 included in the first built-up structure 140 and the second insulating layer 151 and a second film layer 152 included in the second passivation layer 190. For example, the core layer 110 may be formed of a relatively rigid material, and each of the first insulating layer 141, the first film layer 142, the second insulating layer 151, and the second film layer 152 may be formed of a relatively flexible material. Also, the core layer 110 may be formed of a material having low elasticity, having a relatively low limitation in reversible elasticity, and each of the first insulating layer 141, the first film layer 142, the second insulating layer 151, and the second film layer 152 may be formed of a material having high elasticity, having a relatively high limitation in reversible elasticity. Accordingly, each of the first insulating layer 141, the first film layer 142, the second insulating layer 151, and the second film layer 152 may not include a reinforcement material such as glass fiber, glass cloth, glass fabric, or the like. Thus, the printed circuit board in the example embodiment may be bent and/or folded by the second built-up structure 150 in the flexible region F. For example, the printed circuit board in the example embodiment may have a form of a rigid flexible printed circuit board (RFPCB), which is bendable.

Each of the first via 123, the second via 133, a plurality of first vias 144 included in the first built-up structure 140, a plurality of second vias 154 included in the second built-up structure 150, the third via 163, and the fourth via 173 may provide an upper and lower electrical connection path of the printed circuit board in the example embodiment. Each of the first via 123, the plurality of first vias 144 included in the first built-up structure 140, and the third via 163 may have a tapered shape tapered in a direction opposite to a tapered direction of a tapered shape of each of the second via 133, the plurality of second vias 154 included in the second built-up structure 150, and the fourth via 173 with reference to the core layer 110. Accordingly, the printed circuit board in the example embodiment may have a two-sided built-up structure.

The number of the first insulating layer 141 and the first film layer 142 alternately layered may be the same as the number of the second insulating layer 151 and the second film layer 152 alternately layered. Accordingly, the first built-up structure 140 and the second built-up structure 150 may have an upwardly and downwardly symmetrical form in the rigid regions R1 and R2 with reference to the core layer 110. Accordingly, warpage occurring in a process and/or warpage of a product may be prevented in an efficient manner. However, an example embodiment thereof is not limited thereto, and the number of the first insulating layer 141 and the first film layer 142 alternately layered may be different from the number of the second insulating layer 151 and the second film layer 152 alternately layered.

In the description below, the elements of the printed circuit board in the example embodiment will be described in greater detail with reference to the drawings.

The core layer 110 may be disposed in a central portion of a printed circuit board 100A in the example embodiment. The core layer 110 may have an elastic modulus higher than that of each of the first insulating layer 141 and the first film layer 142 included in the first built-up structure 140 and the second insulating layer 151 and the second film layer 152 included in the second passivation layer 190. For example, the core layer 110 may be formed of a relatively rigid material. The core layer 110 may also be formed of a material having low elasticity, having a relatively low limitation in reversible elasticity.

For example, as a material of the core layer 110, a thermosetting resin such as an epoxy resin, a thermoplastic resin such as a polyimide resin, an insulating material in which the thermosetting resin or the thermoplastic resin is impregnated in a core material such as an inorganic filler and/or a glass fiber (or a glass cloth or a glass fabric), such as prepreg, Ajinomoto build-up film (ABF), FR-4, bismaleimide triazine (BT), or the like, may be used, for example. If desired, a photoimageable dielectric (PID) resin may be used.

Each of the first wiring layer 112 and the second wiring layer 113 may provide various wiring lines, and may be connected to each other by the though-via 114. As a material of the first wiring layer 112 and the second wiring layer 113, a conductive material such as copper (Cu), aluminum (Al), silver (Ag), tin (Sn), gold (Au), nickel (Ni), lead (Pb), titanium (Ti), or alloys thereof may be used.

Each of the first wiring layer 112 and the second wiring layer 113 may perform various functions depending on a design of each of the respective layers. For example, each of the first wiring layer 112 and the second wiring layer 113 may include a ground pattern, a power pattern, a signal pattern, and the like. The signal pattern may include various signals other than a ground pattern, a power pattern, and the like, such as a data signal, an antenna signal, and the like, for example.

The though-via 114 may penetrate the core layer 110 and may connect the first wiring layer 112 to the second wiring layer 113. The though-via 114 may perform various functions depending on a design of each of the respective layers. For example, the though-via 114 may include a connection via for signal connection, a connection via for ground connection, a connection via for power connection, and the like.

As a material of the though-via 114, a conductive material such as copper (Cu), aluminum (Al), silver (Ag), tin (Sn), gold (Au), nickel (Ni), lead (Pb), titanium (Ti), or alloys thereof may be used. The though-via 114 may be configured a filled-type via, an internal space of a via hole of which is completely filled with a metal material, or may be a conformal via in which a metal material is formed along a wall of a via hole. When a via hole of the though-via 114 is filled with a conductive material in the though-via 114, an internal space of the via hole may be filled with an insulating material. The though-via 114 may have a generally used shape such as a cylindrical shape, a tapered shape, or the like.

As a material of the first resin layer 121 and the second resin layer 131, an insulating material may be used. Similarly to the core layer 110, an elastic modulus of each of the first resin layer 121 and the second resin layer 131 may be higher than an elastic modulus of each of the first insulating layer 141 and the first film layer 142 included in the first built-up structure 140 and an elastic modulus of each of the second insulating layer 151 and the second film layer 152 included in the second built-up structure 150. However, an example embodiment thereof is not limited thereto. An elastic modulus of each of the first resin layer 121 and the second resin layer 131 may be lower than an elastic modulus of each of the first insulating layer 141 and the first film layer 142 included in the first built-up structure 140 and an elastic modulus of each of the second insulating layer 151 and the second film layer 152 included in the second built-up structure 150. An elastic modulus of each of the first resin layer 121 and the second resin layer 131 may be higher or lower than an elastic modulus of the core layer 110.

For example, as a material of the first resin layer 121 and the second resin layer 131, a thermosetting resin such as an epoxy resin, a thermoplastic resin such as a polyimide resin, an insulating material in which the thermosetting resin or the thermoplastic resin is impregnated in a core material, such as an inorganic filler and/or a glass fiber (or a glass cloth or a glass fabric), such as prepreg, Ajinomoto build-up film (ABF), FR-4, bismaleimide triazine (BT), polyethylene terephthalate (PET), polyethylene naphthalate (PEN), polycarbonate (PC), polyethersulphone (PES), polyarylate (PAR), polycyclic olefin (PCO), polyimide (PI), or the like. If desired, a photoimageable dielectric (PID) resin may be used. However, an example of the material is not limited thereto.

Each of the third wiring layer 122 and the fourth wiring layer 132 may provide various wiring lines, and may be connected to each other by the though-via 114, the first via 123, and the second via 133. As a material of the first wiring layer 112 and the second wiring layer 113, a conductive material such as copper (Cu), aluminum (Al), silver (Ag), tin (Sn), gold (Au), nickel (Ni), lead (Pb), titanium (Ti), or alloys thereof may be used.

Each of the third wiring layer 122 and the fourth wiring layer 132 may perform various functions depending on a design of each of the respective layers. For example, each of the first wiring layer 112 and the second wiring layer 113 may include a ground pattern, a power pattern, a signal pattern, and the like. The signal pattern may include various signals other than a ground pattern, a power pattern, and the like, such as a data signal, an antenna signal, and the like, for example.

The first via 123 may penetrate the first resin layer 121 and may connect the first wiring layer 112 to the third wiring layer 122. The second via 133 may penetrate the second resin layer 131 and may connect the second wiring layer 113 to the fourth wiring layer 132. Each of the first via 123 and the second via 133 may be entirely filled with a conductive material, or a conductive material may be formed along a wall of a via hole. As a shape of each of the first via 123 and the second via 133, a generally used shape such as a tapered shape, a cylindrical shape, or the like, may be used.

The first via 123 and the second via 133 may have tapered shapes, tapered in opposite directions. For example, the first via 123 may have a tapered shape in which a width of an upper side may be greater than a width of a lower side on a cross-sectional surface of the first via 123. The second via 133 may have a tapered shape in which a width of a lower side may be greater than a width of an upper side on a cross-sectional surface of the second via 133.

The first built-up structure 140 may include a plurality of first insulating layers 141, a plurality of first film layers 142 disposed on the plurality of first insulating layers 141, respectively, a plurality of first wiring layers 143 disposed on the plurality of first film layers 142, respectively, and buried in the plurality of first insulating layers 141, respectively, and a plurality of first vias 144 consecutively penetrating the plurality of first insulating layers 141 and the plurality of first film layers 142 and connecting the plurality of first wiring layers 122 and 143, disposed on different levels, to each other.

The second built-up structure 150 may include a plurality of second insulating layers 151, a plurality of second film layers 152 disposed on the plurality of second insulating layers 151, respectively, a plurality of second wiring layers 153 disposed on the plurality of second film layers 152, respectively, and buried in the plurality of second insulating layers 151, respectively, and a plurality of second vias 154 consecutively penetrating the plurality of second insulating layers 151 and the plurality of second film layers 152 and connecting the plurality of second wiring layers 132 and 153, disposed on different levels, to each other.

However, an example embodiment thereof is not limited to the above-described example. Structures of the first built-up structure 140 and the second built-up structure 150 may be varied in example embodiments. For example, the number of each of the bonding layers 141 and 151, the insulating layers 142 and 152, the wiring layers 143 and 153, and/or the vias 144 and 154, included in the first built-up structure 140 and the second built-up structure 150 may be greater or less than the examples illustrated in the diagram.

The first insulating layer 141 and the second insulating layer 151 may be provided to bond the elements. For example, the first insulating layer 141 may be configured to bond the first resin layer 121 to the first insulating layer 141. The first insulating layer 141 may be configured to bond the first insulating layers 141 disposed on different levels. Similarly, the second insulating layer 151 may be configured to bond the second resin layer 131 to the second insulating layer 151. The second insulating layer 151 may also bond the second insulating layers 151 disposed on different levels.

An elastic modulus of each of the first insulating layer 141 and the second insulating layer 151 may be smaller than an elastic modulus of the core layer 110. Also, an elastic modulus of each of the first insulating layer 141 and the second insulating layer 151 may be smaller than an elastic modulus of each of the first to fourth resin layers 121, 131, 161, and 171. For example, each of the first insulating layer 141 and the second insulating layer 151 may be formed of a relatively flexible material. Also, each of the first insulating layer 141 and the second insulating layer 151 may be formed of a material having high elasticity, having a relatively high limitation in reversibly elasticity. For example, polyethylene terephthalate (PET), polyethylene naphthalate (PEN), polycarbonate (PC), polyethersulphone (PES), polyarylate (PAR), polycyclic olefin (PCO), polyimide (PI), or the like, may be used, but an example embodiment thereof of is not limited thereto.

An elastic modulus of each of the first film layer 142 and the second insulating layer 151 may be lower than an elastic modulus of the core layer 110. Also, an elastic modulus of each of the first film layer 142 and the second insulating layer 151 may be lower than an elastic modulus of each of the first to fourth resin layers 121, 131, 161, and 171. For example, each of the first film layer 142 and the second insulating layer 151 may be formed of a relatively flexible material. Also, each of the first film layer 142 and the second insulating layer 151 may be formed of a material having high elasticity, having a relatively high limitation in reversible elasticity. For example, polyethylene terephthalate (PET), polyethylene naphthalate (PEN), polycarbonate (PC), polyethersulphone (PES), polyarylate (PAR), polycyclic olefin (PCO), polyimide (PI), or the like, may be used, but an example embodiment thereof is not limited thereto.

The first insulating layer 141 and the first film layer 142 may be included in a single first flexible layer, and the first built-up structure 140 may include a plurality of first flexible layers. The first wiring layer 143 may be disposed on each of the plurality of first flexible layers. The first via 144 may penetrate each of the plurality of first flexible layers. The second insulating layer 151 and the second film layer 152 may be included in a single second flexible layer, and the second built-up structure 150 may include a plurality of second flexible layers. The second wiring layer 153 may be disposed on each of the plurality of second flexible layers. The second via 154 may penetrate each of the plurality of second flexible layers.

A lowermost first insulating layer 141 of the plurality of first insulating layers 141 may be disposed between the core layer 110 and a lowermost first film layer 142 of the plurality of first film layers 142. An uppermost second insulating layer 151 of the plurality of second insulating layers 151 may be disposed between the core layer 110 and an uppermost second film layer 152 of the plurality of second film layers 152.

Each of the first wiring layer 143 and the second wiring layer 153 may provide various wiring lines. As a material of the first wiring layer 143 and the second wiring layer 153, a conductive material such as copper (Cu), aluminum (Al), silver (Ag), tin (Sn), gold (Au), nickel (Ni), lead (Pb), titanium (Ti), or alloys thereof may be used.

Each of the first wiring layer 143 and the second wiring layer 153 may perform various functions. For example, each of the first wiring layer 143 and the second wiring layer 153 may include a ground pattern, a power pattern, a signal pattern, and the like. The signal pattern may include various signals other than a ground pattern, a power pattern, and the like, such as a data signal, an antenna signal, and the like, for example.

At least a portion of the second wiring layers 153 may be disposed in a flexible region. For example, at least a portion of the second wiring layers 153 may be disposed on a lower side of a first penetration portion H1. Also, at least a portion of the second wiring layers 153 may be disposed on a lower side of a second penetration portion H2. Accordingly, at least a portion of the second wiring layers 153 may be disposed on a level between the first penetration portion H1 and the second penetration portion H2.

The first via 144 and the second via 154 may provide an upper and lower electrical connection path to each of the first built-up structure 140 and the second built-up structure 150, respectively. As a material of the first via 144 and the second via 154, a conductive material such as copper (Cu), aluminum (Al), silver (Ag), tin (Sn), gold (Au), nickel (Ni), lead (Pb), titanium (Ti), or alloys thereof may be used.

Each of the first via 144 and the second via 154 may perform various functions depending on a design of each of the respective layers. For example, each of the first via 144 and the second via 154 may include a connection via for signal connection, a connection via for ground connection, a connection via for power connection, and the like.

Each of the first via 144 and the second via 154 may be entirely filled with a conductive material, or a conductive material may be formed along a wall of a via hole. As a shape of each of the first via 144 and the second via 154, a generally used shape such as a tapered shape, a cylindrical shape, or the like, may be used.

The first via 144 and the second via 154 may have tapered shapes, tapered in opposite directions. For example, the first via 144 may have a tapered shape in which a width of an upper side may be greater than a width of a lower side on a cross-sectional surface of the first via 144. The second via 154 may have a tapered shape in which a width of a lower side may be greater than a width of an upper side on a cross-sectional surface of the second via 154.

As a material of the third resin layer 161 and the fourth resin layer 171, an insulating material may be used. Similarly to the core layer 110, an elastic modulus of each of the third resin layer 161 and the fourth resin layer 171 may be higher than an elastic modulus of each of the first insulating layer 141 and the first film layer 142 included in the first built-up structure 140 and an elastic modulus of each of the second insulating layer 151 and the second film layer 152 included in the second built-up structure 150. However, an example embodiment thereof is not limited thereto. An elastic modulus of each of the third resin layer 161 and the fourth resin layer 171 may be lower than an elastic modulus of each of the first insulating layer 141 and the first film layer 142 included in the first built-up structure 140 and an elastic modulus of each of the second insulating layer 151 and the second film layer 152 included in the second built-up structure 150. An elastic modulus of each of the third resin layer 161 and the fourth resin layer 171 may be higher or lower than an elastic modulus of the core layer 110.

For example, as a material of the third resin layer 161 and the fourth resin layer 171, a thermosetting resin such as an epoxy resin, a thermoplastic resin such as a polyimide resin, an insulating material in which the thermosetting resin or the thermoplastic resin is impregnated in a core material such as an inorganic filler and/or a glass fiber (or a glass cloth or a glass fabric), such as prepreg, Ajinomoto build-up film (ABF), FR-4, bismaleimide triazine (BT), polyethylene terephthalate (PET), polyethylene naphthalate (PEN), polycarbonate (PC), polyethersulphone (PES), polyarylate (PAR), polycyclic olefin (PCO), polyimide (PI), or the like. If desired, a photoimageable dielectric (PID) resin may be used. However, an example of the material is not limited thereto.

Each of the fifth wiring layer 162 and the sixth wiring layer 172 may provide various wiring lines. As a material of the fifth wiring layer 162 and the sixth wiring layer 172, a conductive material such as copper (Cu), aluminum (Al), silver (Ag), tin (Sn), gold (Au), nickel (Ni), lead (Pb), titanium (Ti), or alloys thereof may be used.

Each of the fifth wiring layer 162 and the sixth wiring layer 172 may perform various functions depending on a design of each of the respective layers. For example, each of the fifth wiring layer 162 and the sixth wiring layer 172 may include a ground pattern, a power pattern, a signal pattern, and the like. The signal pattern may include various signals other than a ground pattern, a power pattern, and the like, such as a data signal, an antenna signal, and the like, for example.

The third via 163 may penetrate the third resin layer 161, and may connect the fifth wiring layer 162 to a wiring layer 143 included in the first built-up structure 140. The fourth via 173 may penetrate the fourth resin layer 171 and may connect the sixth wiring layer 172 to a wiring layer 153 included in the second built-up structure 150. Each of the third via 163 and the fourth via 173 may be entirely filled with a conductive material, or a conductive material may be formed along a wall of a via hole. As a shape of each of the third via 163 and the fourth via 173, a generally used shape such as a tapered shape, a cylindrical shape, or the like, may be used.

The third via 163 and the fourth via 173 may have tapered shapes, tapered in opposite directions. For example, the third via 163 may have a tapered shape in which a width of an upper side may be greater than a width of a lower side on a cross-sectional surface of the third via 163. The fourth via 173 may have a tapered shape in which a width of a lower side may be greater than a width of an upper side on a cross-sectional surface of the fourth via 173.

The first passivation layer 180 and the second passivation layer 190 may protect the internal elements of the printed circuit board of the example embodiment from external physical and chemical damages. Each of the first passivation layer 180 and the second passivation layer 190 may include a thermosetting resin and an inorganic filler. For example, each of the first passivation layer 180 and the second passivation layer 190 may be configured as an ABF. However, an example embodiment thereof is not limited thereto, and each of the first passivation layer 180 and the second passivation layer 190 may be configured as a generally used photosensitive insulating layer, such as a solder resist (SR), for example. The first passivation layer 180 and the second passivation layer 190 may include the same type of material, and may have the same thickness. However, an example embodiment thereof is not limited thereto. The first passivation layer 180 and the second passivation layer 190 may include different types of materials, and may have different thicknesses.

The first passivation layer 180 may have an opening (no reference numeral) for exposing at least a portion of the fifth wiring layer 162. The second passivation layer 190 may have one or more openings (no reference numeral) for exposing at least a portion of the opening (no reference numeral) for exposing at least a portion of the plurality of sixth wiring layers 172. A surface process layer may be formed on each of the exposed surfaces of the fifth wiring layer 162 and/or the plurality of sixth wiring layers 172. The surface process layer may be formed by an electrolytic gold-plating process, an electroless gold-plating process, an OSP process or electroless tin-plating process, an electroless silver-plating process, an electroless nickel-plating process/substitution gold-plating process, a DIG plating process, an HASL process, or the like. If desired, the opening of each of the first passivation layer 180 and the second passivation layer 190 may include a plurality of via holes.

Figure 4A:
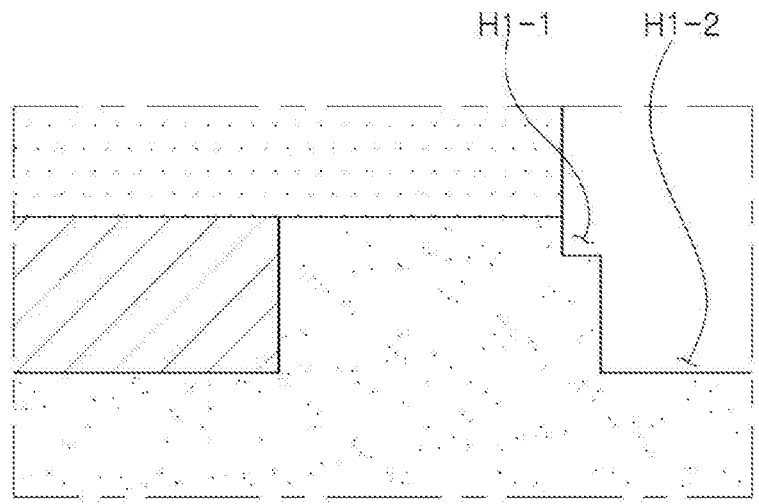
FIGS. 4A and 4B are enlarged cross-sectional diagrams illustrating a portion of a printed circuit board according to an example embodiment of the present disclosure.
Figure 4B:
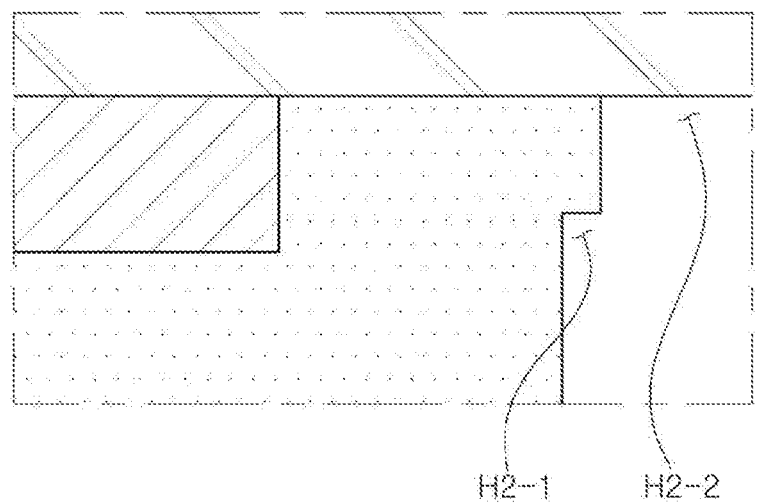

FIGS. 4A to 4B are enlarged cross-sectional diagrams illustrating a portion of a printed circuit board according to an example embodiment.

FIG. 4A is an enlarged cross-sectional diagram illustrating region A of the printed circuit board of the example embodiment. FIG. 4B is an enlarged cross-sectional diagram illustrating region B of the printed circuit board of the example embodiment.

Referring to the diagrams, a width of a 1-1 penetration portion H1-1 may be greater than a width of a 1-2 penetration portion H1-2. The width refers to a length measured in a third direction 3 or a fourth direction 4. Also, a width of a 2-1 penetration portion H2-1 may be greater than a width of 2-2 penetration portion H2-2. The above-described characteristics may appear as a polymer layer is used to forma first penetration portion H1 and a second penetration portion H2.

Figure 5A:
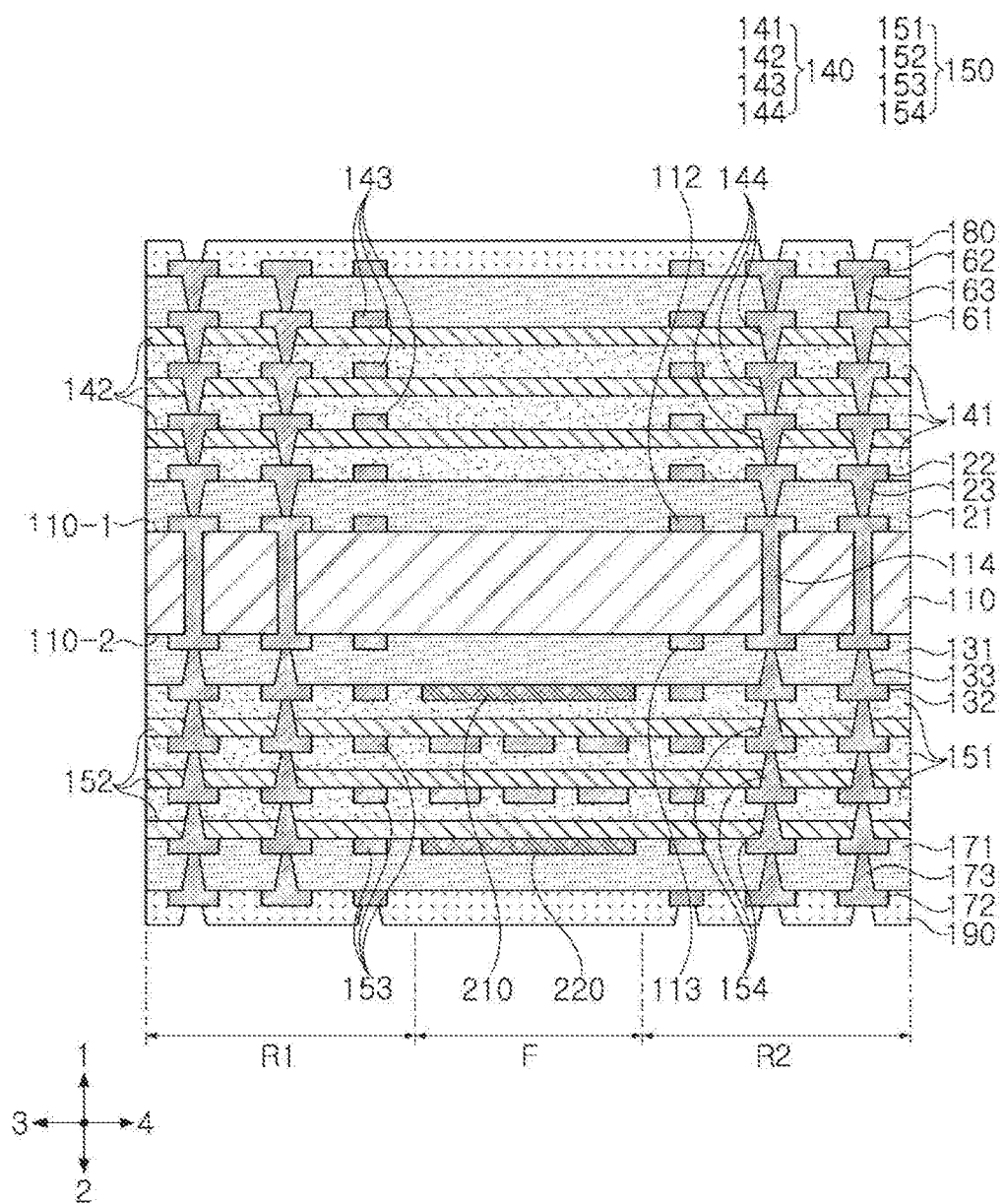
FIGS. 5A to 5C are cross-sectional diagrams illustrating processes of manufacturing a printed circuit board according to an example embodiment of the present disclosure.
Figure 5B:
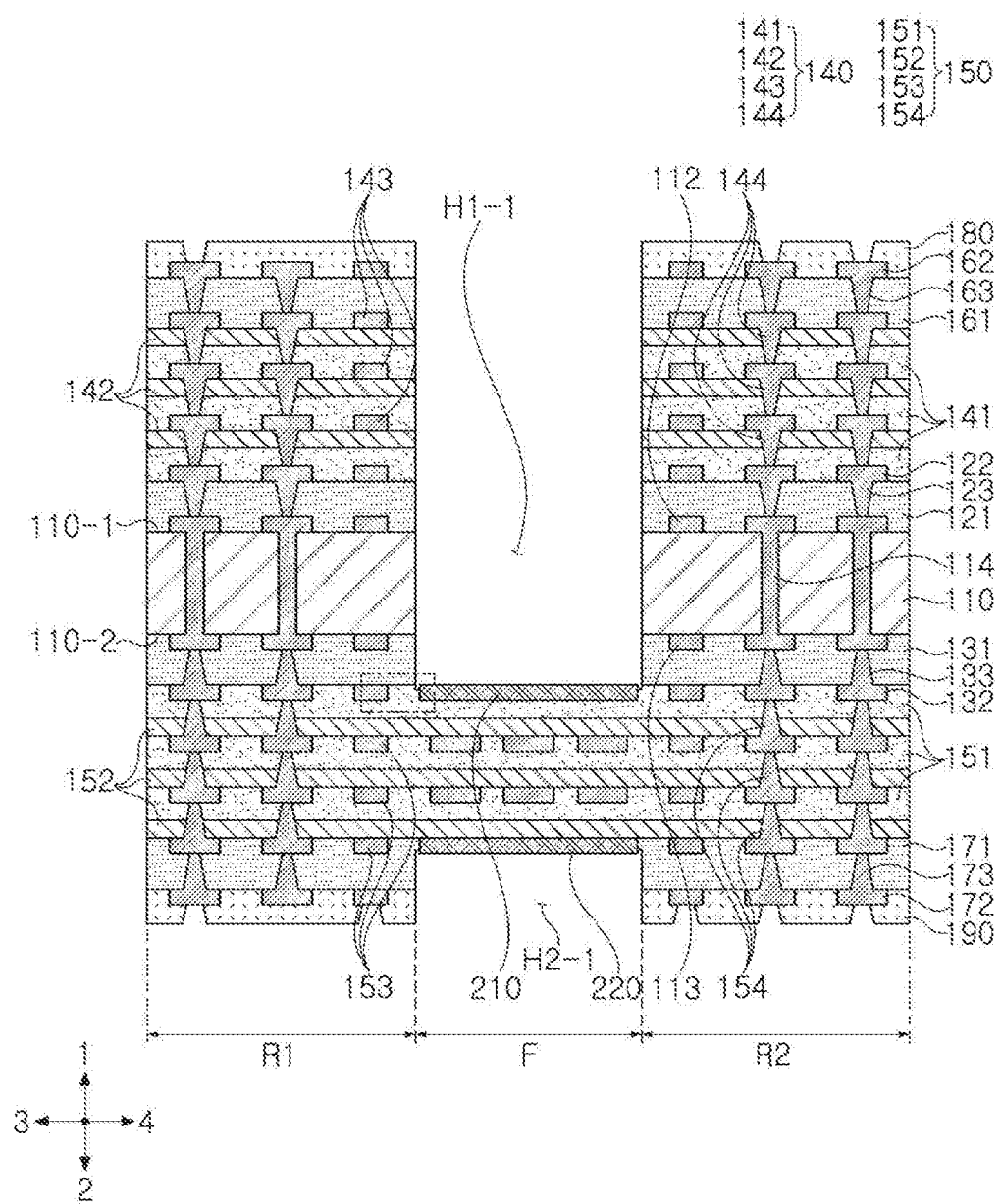
Figure 5C:
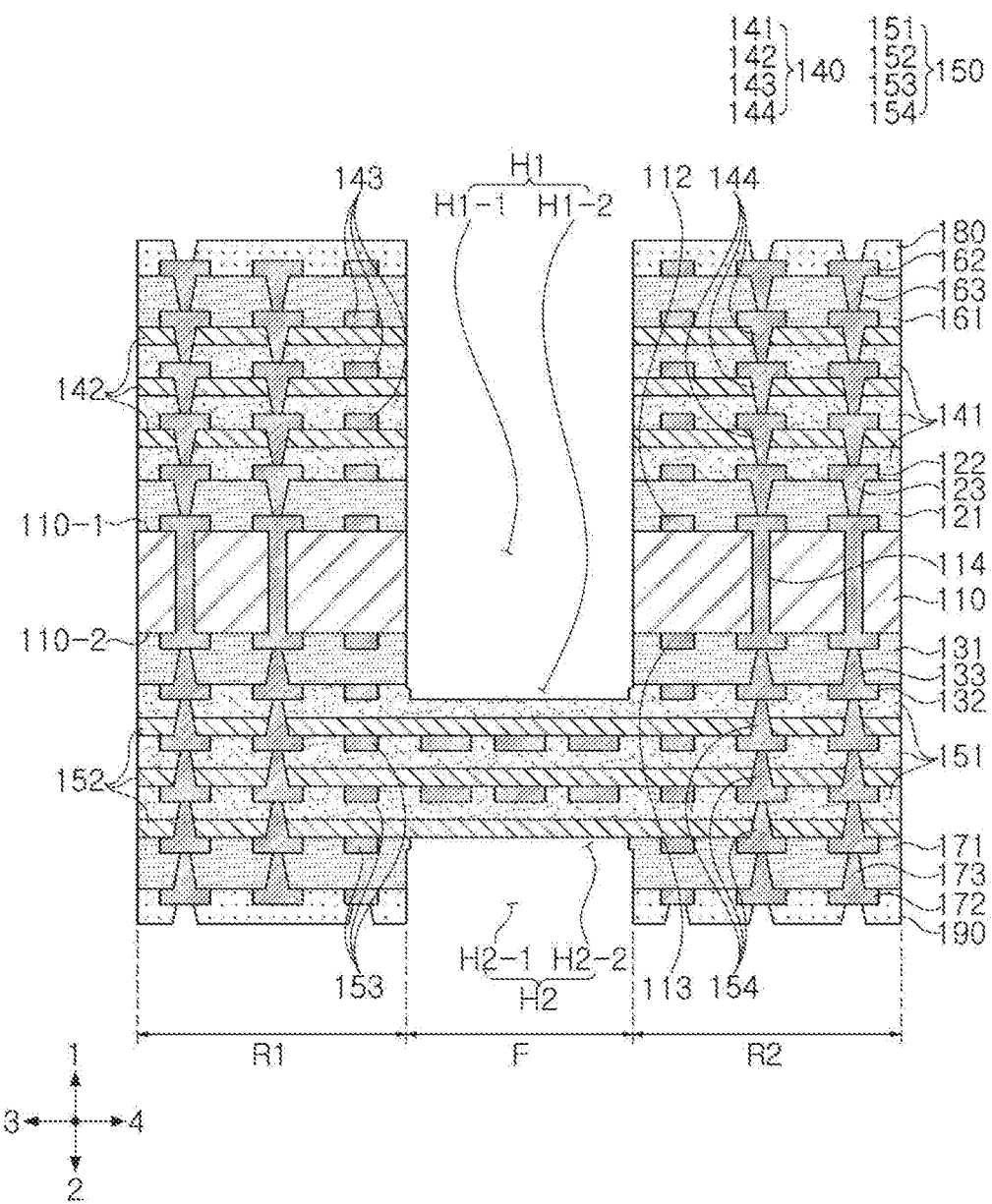

FIGS. 5A to 5C are cross-sectional diagrams illustrating processes of manufacturing a printed circuit board according to an example embodiment.

Referring to FIG. 5A, in the printed circuit board, a first resin layer 121, a first built-up structure 140, and a third resin layer 161 may be stacked in order on a first surface 110-1 of a core layer 110. Also, in the printed circuit board, a second resin layer 131, a second built-up structure 150, and a fourth resin layer 171 may be stacked in order on a second surface 110-2 of the core layer 110. A wiring layer may be buried in each of the first resin layer 121, the first insulating layer 141, the third resin layer 161, the second resin layer 131, the second insulating layer 151, and the fourth resin layer 171.

When a fourth wiring layer 132 is formed on the second resin layer 131, a first polymer layer 210 may also be formed in a region corresponding to a region in which the first penetration portion H1 is formed. Also, when the wiring layer 153 disposed on a lowermost side of the second built-up structure 150 is disposed on the insulating layer 152 disposed on a lowermost side of the second built-up structure 150, a second polymer layer 220 may also be disposed in a region corresponding to a region in which the second penetration portion H2 is formed. Each of the first polymer layer 210 and the second polymer layer 220 may be disposed in the stacking process in the second direction 2. Each of the first polymer layer 210 and the second polymer layer 220 may work as a process stopping layer when each of the first penetration portion H1 and the second penetration portion H2 is formed.

In the diagrams, thicknesses of the first polymer layer 210 and the fourth wiring layer 132 may be the same, but an example embodiment thereof is not limited thereto. Thicknesses of the first polymer layer 210 and the fourth wiring layer 132 may be different from each other. A thickness of each of the second polymer layer 220 and the wiring layer 153 disposed on a lowermost side of the second built-up structure 150 may be the same or may be different from each other. A thickness of each of the first polymer layer 210 and the second polymer layer 220 may also be the same or may be different from each other.

The first polymer layer 210 and the second polymer layer 220 may be formed by attaching dry films and performing an exposure and development process to the dry films. Alternatively, the first polymer layer 210 and the second polymer layer 220 may be formed by applying a liquid photosensitizer, instead of a dry film, and performing exposure and development processes, or by applying a liquid resist ink to a region in which the first penetration portion H1 and/or the second penetration portion H2 are formed and curing the ink. However, an example embodiment thereof is not limited thereto. The first polymer layer 210 and the second polymer layer 220 may be formed of any material having strength for working as a process stopping layer when the first penetration portion H1 and/or the second penetration portion H2 are formed through a mechanical process. The first polymer layer 210 and the second polymer layer 220 may be formed of a material having strength higher than strength of a material of each of the second insulating layer 151 and the fourth resin layer 171.

Referring to FIGS. 5B and 5C, the 2-1 penetration portion H2-1 and the 2-2 penetration portion H2-2 may be formed by forming the 1-1 penetration portion H1-1 and the 1-2 penetration portion H1-2 and separating the first polymer layer 210 and the second polymer layer 220.

The first penetration portion H1 and the second penetration portion H2 may be formed using a mechanical process method such as a sand blast process, a depth router process, or the like. In this case, the first polymer layer 210 and the second polymer layer 220 may work as process stopping layers as described above. Accordingly, by separating the first polymer layer 210 and the second polymer layer 220 after processing the first penetration portion H1 and the second penetration portion H2, the printed circuit board of the example embodiment may be provided.

A portion of each of the second insulating layer 151 and the fourth resin layer 171 may also be processed along a circumference of each of the first polymer layer 210 and the second polymer layer 220 when the 1-1 penetration portion H1-1 and the 1-2 penetration portion H1-2 are processed. Accordingly, after removing the first polymer layer 210 and the second polymer layer 220, the first penetration portion H1 may include the 1-1 penetration portion H1-1 and the 1-2 penetration portion H1-2 having a width narrower than a width of the 1-1 penetration portion H1-1, and the second penetration portion H2 may include the 2-1 penetration portion H2-1 and the 2-2 penetration portion H2-2 having a width narrower than a width of the 2-1 penetration portion H2-1.

As described above, the first polymer layer 210 for forming the first penetration portion H1 may be disposed in the stacking process in the second direction 2. Also, the first penetration portion H1 may be formed in the second direction 2. Accordingly, the first penetration portion H1 may be formed on an upper side of the first polymer layer 210, and a portion of the second insulating layer 151 in which the first polymer layer 210 is buried may remain on a lower side of the first penetration portion H1.

Also, as described above, the second polymer layer 220 for forming the second penetration portion H2 may also be disposed in the stacking process in the second direction 2. The second penetration portion H2 may be formed in the first direction 1. Accordingly, the second penetration portion H2 may be formed on a lower side of the second polymer layer 220, and the fourth resin layer 171 may not remain in a region corresponding to a region in which the second penetration portion H2 is formed.

When a penetration portion penetrating a portion of a substrate, rather than penetrating through an overall region of the substrate, is formed, a metal layer such as copper may be used as a stopper layer and a laser process may be performed to form the penetration portion. After forming the penetration portion, a remaining stopper layer may be removed through an etching process.

In the example embodiment, a polymer layer which may easily be separated, rather than a metal layer such as copper, may be used as the stopper layer to form the penetration portion. Accordingly, a process such as an etching process may not be necessary such that processes may be simplified and costs may be reduced.

In the example embodiment, as a metal layer is not used as a stopper layer, the first penetration portion H1 and the second penetration portion H2 may be formed by consecutively processing an insulating material. Accordingly, not a wiring layer, a metal layer, but at least one of the core layer 110, the first resin layer 121, the second resin layer 131, the first insulating layer 141, the first film layer 142, the third resin layer 161, and the first passivation layer 180 may be disposed on a wall of the first penetration portion H1. Similarly, at least one of the fourth resin layer 171 and the second passivation layer 190 may be disposed on a wall of the second penetration portion H2.

According to the aforementioned example embodiments, the printed circuit board having a penetration portion configured as a flexible region may be provided.

Also, the printed circuit board in which a polymer layer, rather than a metal layer such as copper, is used as a stopper layer to form a penetration portion may be provided.

In the example embodiments, "upper side" and "upper surface" refer to a side taken in the first direction 1 and a surface taken in the first direction 1, respectively, and "lower side" and "lower surface" may refer to a side taken in a second direction 2 and a surface taken in a second direction 2, respectively. The uppermost side refers to an uppermost side formed in the first direction 1, and the lowermost side refers to a lowermost side formed in the second direction 2.

In the example embodiments, the configuration in which an element is disposed on another element is not limited to the configuration in which the element is disposed on an upper side or an upper surface of another element. For example, the configuration in which an element is disposed on another element may indicate that the element is disposed on a lower side or a lower surface of another element.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

The terms used in the example embodiments are used to simply describe an example embodiment, and are not intended to limit the present disclosure. A singular term includes a plural form unless otherwise indicated.

While the example embodiments have been shown and described above, it will be apparent to those skilled in the art that modifications and variations could be made without departing from the scope of the present invention as defined by the appended claims.

What is claimed is:

1. A printed circuit board, comprising:
a core layer having a first surface and a second surface opposing the first surface;
a first built-up structure disposed on the first surface of the core layer and including a plurality of first insulating layers and a plurality of first wiring layers;
a second built-up structure disposed on the second surface of the core layer and including a plurality of second insulating layers and a plurality of second wiring layers; and
a first penetration portion penetrating the first built-up structure and the core layer and penetrating a portion of the second built-up structure,
wherein the first penetration portion has a step portion on at least a portion of a wall of the first penetration portion in the region of the first penetration portion penetrating the second built-up structure, and
wherein the first penetration portion includes a 1-1 penetration portion penetrating the first built-up structure and the core layer and penetrating a portion of an uppermost second insulating layer of the plurality of second insulating layers, and a 1-2 penetration portion extending from the 1-1 penetration portion and penetrating another portion of the uppermost second insulating layer, and
wherein a width of the 1-1 penetration portion in the portion of the uppermost second insulating layer is greater than a width of the 1-2 penetration portion in the another portion of the uppermost second insulating layer.

2. The printed circuit board of claim 1, wherein at least one of the core layer, the first insulating layer, and the uppermost second insulating layer is disposed on a wall of the first penetration portion.

3. The printed circuit board of claim 1,
wherein the first built-up structure further includes a plurality of first film layers disposed on the plurality of first insulating layers, respectively,
wherein the second built-up structure further includes a plurality of second film layers disposed on the plurality of second insulating layers, respectively,
wherein the plurality of first wiring layers are disposed on the plurality of second film layers, respectively, and are buried in the plurality of first insulating layers, respectively, and
wherein the plurality of second wiring layers are disposed on the plurality of second film layers, respectively, and are buried in the plurality of second insulating layers, respectively.

4. The printed circuit board of claim 3,
wherein a lowermost first insulating layer of the plurality of first insulating layers is disposed between the core layer and a lowermost first film layer of the plurality of first film layers, and
wherein the uppermost second insulating layer is disposed between the core layer and an uppermost second film layer of the plurality of second film layers.

5. The printed circuit board of claim 1, further comprising:
a first resin layer disposed on a side opposite to a side of the first built-up structure on which the core layer is disposed;
a third wiring layer disposed on the first resin layer and connected to the plurality of first wiring layers;
a second resin layer disposed on a side opposite to a side of the second built-up structure on which the core layer is disposed; and
a fourth wiring layer disposed on the second resin layer and connected to the plurality of second wiring layers,
wherein the first penetration portion further penetrates the first resin layer.

6. The printed circuit board of claim 5, further comprising:
a second penetration portion penetrating the second resin layer.

7. The printed circuit board of claim 6, wherein the second resin layer is disposed on a wall of the second penetration portion.

8. The printed circuit board of claim 6, wherein a depth of the first penetration portion is different from a depth of the second penetration portion.

9. The printed circuit board of claim 1, further comprising:
a first resin layer disposed between the core layer and the first built-up structure;
a third wiring layer disposed on the first surface of the core layer, buried in the first resin layer, and connected to the plurality of first wiring layers;
a second resin layer disposed between the core layer and the second built-up structure; and
a fourth wiring layer disposed on the second surface of the core layer, buried in the second resin layer, and connected to the plurality of second wiring layers,
wherein the first penetration portion further penetrates the first resin layer and the second resin layer.

10. The printed circuit board of claim 9, further comprising:
a through-via penetrating the core layer, and connecting the third wiring layer to the fourth wiring layer.

11. The printed circuit board of claim 1, wherein at least a portion of one or more of the plurality of second wiring layers is disposed in the flexible region.

12. The printed circuit board of claim 1,
wherein the first built-up structure further includes a plurality of first vias penetrating the plurality of first insulating layers, respectively, and connecting the plurality of first wiring layers, disposed on different levels, to each other, and
wherein the second built-up structure further includes a plurality of second vias penetrating the plurality of second insulating layers, respectively, and connecting the plurality of second wiring layers, disposed on different levels, to each other.

13. The printed circuit board of claim 1, wherein a region including the first penetration portion on a plane is configured as a flexible region.

14. The printed circuit board of claim 13, wherein side surfaces of portions of the core layer disposed on opposing sides of the first penetration portion directly face each other.

15. A printed circuit board, comprising:
a core layer having a first surface and a second surface opposing the first surface;
a first built-up structure disposed on the first surface of the core layer and including a plurality of first insulating layers and a plurality of first wiring layers;
a second built-up structure disposed on the second surface of the core layer and including a plurality of second insulating layers and a plurality of second wiring layers;
a first penetration portion penetrating the first built-up structure and the core layer and penetrating a portion of the second built-up structure;
a second resin layer disposed on a side opposite to a side of the second built-up structure on which the core layer is disposed;
a fourth wiring layer disposed on the second resin layer and connected to the plurality of second wiring layers; and
a second penetration portion penetrating the second resin layer;
wherein the first penetration portion has a step portion on at least a portion of a wall of the first penetration portion in the region of the first penetration portion penetrating the second built-up structure, and
wherein a region including the first penetration portion on a plane is configured as a flexible region,
wherein the second penetration portion includes a 2-1 penetration portion penetrating a portion of the second resin layer, and a 2-2 penetration portion extending from the 2-1 penetration portion and penetrating another portion of the second resin layer, and
wherein a width of the 2-1 penetration portion is greater than a width of the 2-2 penetration portion.

16. A printed circuit board comprising:
first and second rigid regions; and
a flexible region disposed between the first and second rigid regions,
wherein the printed circuit board comprising:
a plurality of insulating layers;
a plurality of wiring layers buried in the plurality of insulating layers, respectively; and
a penetration portion penetrating a portion of at least one insulating layer of the plurality of insulating layers in the flexible region,
wherein the penetration portion has a step portion on at least a portion of a wall of the penetration portion,
wherein the penetration portion includes a 1-1 penetration portion penetrating a portion of one insulating layer of the plurality of insulating layers, and a 1-2 penetration portion extending from the 1-1 penetration portion and penetrating another portion of the one insulating layer,
wherein a width of the 1-1 penetration portion in the portion of the one insulating layer in the flexible region is greater than a width of the 1-2 penetration portion in the another portion of the one insulating layer in the flexible region, and
wherein the one insulating layer of the plurality of insulating layers is disposed in both the first and second rigid regions.

17. The printed circuit board of claim 16, wherein the portion of the wall of the penetration portion having the step portion is made of a same material.

18. The printed circuit board of claim 16, wherein a bottom of the penetration portion is made of a material different from a material of the portion of the wall of the penetration portion having the step portion.

19. The printed circuit board of claim 16, wherein a bottom of the penetration portion is made of a material the same as a material of the portion of the wall of the penetration portion having the step portion.

20. A printed circuit board having a flexible region, the printed circuit board comprising:
a plurality of insulating layers;
a plurality of wiring layers buried in the plurality of insulating layers, respectively;
a penetration portion penetrating a portion of at least one insulating layer of the plurality of insulating layers in the flexible region; and
another penetration portion in the flexible region,
wherein the penetration portion has a step portion on at least a portion of a wall of the penetration portion,
wherein the penetration portion includes a 1-1 penetration portion penetrating a portion of one insulating layer of the plurality of insulating layers, and a 1-2 penetration portion extending from the 1-1 penetration portion and penetrating another portion of the one insulating layer,
wherein a width of the 1-1 penetration portion in the portion of the one insulating layer is greater than a width of the 1-2 penetration portion in the another portion of the one insulating layer,
wherein the penetration portion and the another penetration portion are disposed on opposing sides of the flexible region, and
wherein a depth of the penetration portion and a depth of the another penetration portion are different.

* * * * *